(12) United States Patent
Siaudeau

(10) Patent No.: US 7,629,186 B2
(45) Date of Patent: Dec. 8, 2009

(54) SYSTEM AND METHOD FOR IDENTIFICATION OF A REFERENCE INTEGRATED CIRCUIT FOR A PICK-AND-PLACE EQUIPMENT

(75) Inventor: Jean-Louis Siaudeau, Rousset (FR)

(73) Assignee: STMicroelectronics SA, Montrouge (FR)

( * ) Notice: Subject to any disclaimer, the term of this patent is extended or adjusted under 35 U.S.C. 154(b) by 486 days.

(21) Appl. No.: 11/392,130

(22) Filed: Mar. 29, 2006

(65) Prior Publication Data

US 2006/0219943 A1    Oct. 5, 2006

(30) Foreign Application Priority Data

Mar. 29, 2005    (FR)    ................................. 05 50793

(51) Int. Cl.
*H01L 21/66* (2006.01)
*G01R 31/26* (2006.01)
*H01L 23/58* (2006.01)
*H01L 23/544* (2006.01)

(52) U.S. Cl. ........................... 438/16; 257/48; 257/797; 257/E21.529; 257/E23.179

(58) Field of Classification Search ................... 438/16; 257/48
See application file for complete search history.

(56) References Cited

U.S. PATENT DOCUMENTS

| 6,380,000 B1 | 4/2002 | Subramanian |
| 6,756,796 B2 | 6/2004 | Subramanian |

FOREIGN PATENT DOCUMENTS

| DE | 10219346 A1 | 11/2003 |
| EP | 1424723 A2 | 6/2004 |
| JP | 63136542 | 6/1988 |
| JP | 01218019 | 8/1989 |

OTHER PUBLICATIONS

French Search Report, FR663454, Feb. 7, 2006.

*Primary Examiner*—David A Zarneke
(74) *Attorney, Agent, or Firm*—Lisa K. Jorgenson; Paul F. Rusyn; Graybeal Jackson LLP

(57) ABSTRACT

A method and a system of alignment of an integrated circuit chip pick-and-place equipment with an origin of a wafer supporting these circuits, comprising optically searching on the wafer at least one reference pattern formed, on manufacturing of the integrated circuits, in a reference chip, the reference pattern being different from optically-recognizable patterns of the other chips.

20 Claims, 2 Drawing Sheets

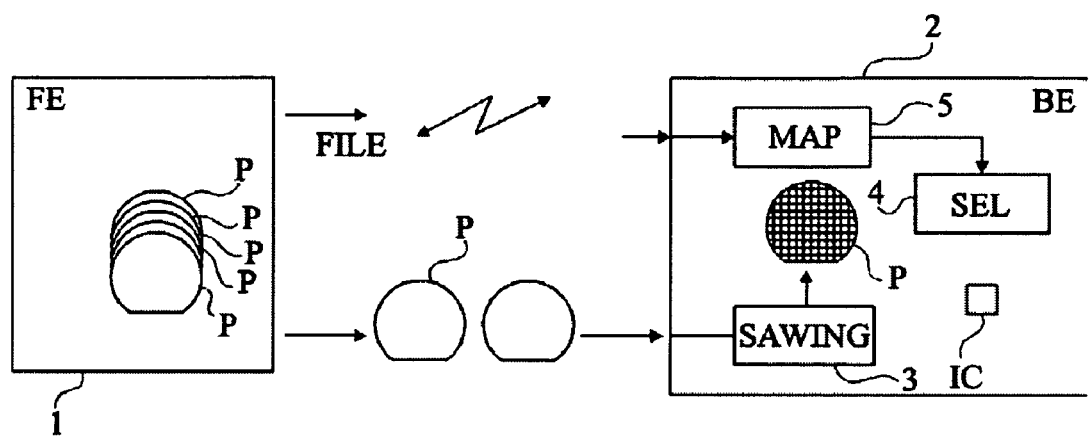
Fig 1
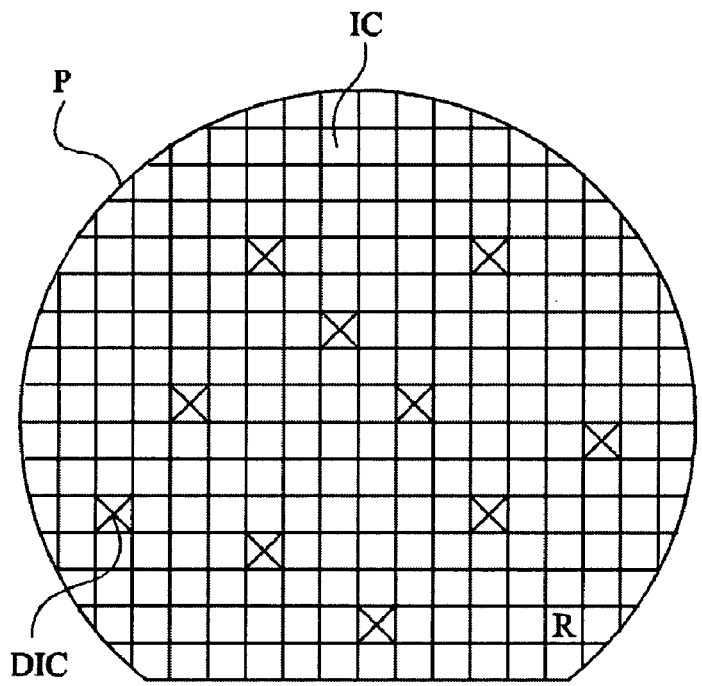
Fig 2
Fig 3

SYSTEM AND METHOD FOR IDENTIFICATION OF A REFERENCE INTEGRATED CIRCUIT FOR A PICK-AND-PLACE EQUIPMENT

PRIORITY CLAIM

This application claims priority from French patent application No. 05/50793, filed Mar. 29, 2005, which is incorporated herein by reference.

TECHNICAL FIELD

Embodiments of the present invention relate in general to electronic circuits and in particular to the operation of automatically picking up integrated circuits after sawed from a wafer, by so-called pick-and-place equipment, for assembly in another circuit or in a package.

Embodiments of the present invention more specifically relate to the identification of a reference chip in an integrated circuit wafer to initialize equipment for automatically picking and placing the chips after sawing.

BACKGROUND

The manufacture of integrated electronic circuits, being passive or active components, from semiconductor or insulating wafers, is generally performed in circuit batches, which may or may not be identical, on the same wafer. Once the circuits have been manufactured, they are generally tested, for example, by means of a probe testing board, to detect possible defective circuits. Such defective circuits are then identified so as not to be selected from the wafer after sawing by the pick-and-place equipment.

FIG. 1 shows very schematically in block form an example of a system for manufacturing integrated circuits IC from wafers P, for example, semiconductor wafers.

Generally, the process of manufacturing integrated circuits in batches on a same wafer P is performed in a first manufacturing location 1 (symbolized by a block FE, "Front End") in which the integrated circuits are formed on the wafers and are tested.

A first known method of identifying possibly defective circuits consists of depositing an ink drop (inking) on these circuits to enable their subsequent recognition by optical devices associated with the pick-and-place equipment.

A second known technique to which embodiments of the present invention apply consists of recording a file containing the coordinates (generally rectangular) of the defective (or conversely, valid) circuits in the wafer to enable subsequent tracking thereof.

In such a case, the file containing the coordinates of the good and/or bad wafers is transmitted, simultaneously with wafers P, to another manufacturing location (BE or "Back End") symbolized by a block 2, in which the wafers are sawed (block 3, SAWING) after usually having been placed on an adhesive support disk or film. Sawed wafers P resulting from this step are then processed by a pick-and-place equipment (not shown) provided with elements (block 4, SEL) for selecting the correct integrated circuits IC from a mapping (block 5, MAP) derived from the transmitted coordinate file. The mappings of the different tested wafers are stored with an identifier of the wafer, in the form of digital files at the wafer manufacturing site and at the assembly site, by for example transferring them through a central server (not shown).

FIGS. 2 and 3 respectively illustrate, by means of a schematic plan view of an integrated circuit wafer P and a table T of coordinates of defective or valid circuits, the operation of a pick-and-place circuit of the type to which embodiments of the present invention apply. Coordinates X and Y of the different integrated circuits IC stored in table T correspond either to the valid integrated circuits IC of FIG. 2, or to defective integrated circuits DIC illustrated in FIG. 2 with crosses. Visually, such defective circuits are not differentiated from correct circuits since embodiments of the present invention relate to an inkless circuit.

To enable initial alignment of the pick-and-place equipment with respect to the wafer, a reference chip (R, FIG. 2), for which the pick-and-place equipment will search based on the file coordinates, is generally selected, allowing subsequent processing of the coordinates contained in the file associated with the wafer. This reference chip enables the validation of an origin position of the mapping in the reference frame of the equipment.

For example, an approximate calculation of the wafer center is exploited to align the equipment (more specifically its visual or optical sensor) on reference chip R based on the coordinates read from a file. Then, a location in the chip (often a corner) to which the coordinates correspond is searched by successive iterations. Once the position of the reference chip is known in the reference frame of the equipment, the rest of the file becomes, in principle, interpretable. The valid chips are then picked from the adhesive support disk, generally by a line scanning of the wafer chips, the defective chips being left on the disk.

Known methods and systems of this type are described, for example, in U.S. Pat. Nos. 6,380,000 and 6,756,796.

Such a solution is acceptable for chips of relatively large dimensions but becomes unsatisfactory as the chip size decreases. Indeed, the wafer sawing generally generates an expansion due the flexibility of the film then supporting the different chips. This expansion added to the alignment tolerances generates a risk that the approximate alignment will select an erroneous reference chip (the chip neighboring the reference chip). In the case of an error of this type, the use of the coordinate file becomes incorrect.

Using two reference chips at two different locations of the wafer to correct possible positioning tolerances has been proposed.

A disadvantage of such a solution is that if the pick-and-place equipment stops (for example, accidentally), upon restarting it is impossible to recover the reference if one of these reference chips has been picked for assembly.

It could have been envisioned to record the coordinates of the reference chips but to leave them on the support film and not to pick them for assembly. A disadvantage is then that two chips per wafer are lost if the chips present at the reference positions are correct. Further, picking these chips last adversely affects the efficiency of the equipment by requiring a reverse during scanning. Further, this does not solve the problem for the case where several chips of different sizes and destinations are supported by a same wafer.

DE-A-10219346 and JP-A-63136542 disclose processes wherein chips are marked after manufacturing.

EP-A-1424723 discloses a chip marking method by geometrical patterns made during manufacturing that necessitates a post-manufacturing step for having the patterns optically recognizable.

SUMMARY

An embodiment of the present invention is overcoming all or some of the disadvantages of methods and systems for the assembly of integrated circuit chips after being sawed from a wafer.

Another embodiment of the present invention aims at solving problems of alignment of an origin position on a wafer to be processed by the pick-and-place equipment.

Yet another embodiment of the present invention also aims at providing a solution which does not cause the loss of valid chips.

One embodiment of the present invention also aims at providing a solution compatible with the batch manufacturing steps from which the chips are provided.

Another embodiment of the present invention also aims at providing a solution compatible with conventional pick-and-place equipment.

According to one embodiment, the present invention provides a method of alignment of an integrated circuit chip pick-and-place equipment with an origin position of a wafer that supports these circuits wherein at least one reference pattern formed on a reference chip during manufacturing of the integrated circuits is optically searched on the wafer, the reference pattern being different from optically-recognizable patterns on other chips, and comprising geometric patterns that can be optically recognized in the passivation level or in the last metallization level of the wafer.

According to an embodiment of the present invention, several reference chips are distributed in the wafer.

Another embodiment of the present invention provides a system of integrated circuit assembly by means of a visual recognition pick-and-place equipment.

A further embodiment of the present invention provides an integrated circuit wafer, comprising at least one reference chip comprising at least one optically-recognizable pattern, different from the patterns of the other chips formed in the wafer and formed by the last metal level of the wafer or by a different masking of the passivation level.

Features and advantages of the present invention will be discussed in detail in the following non-limiting description of specific embodiments in connection with the accompanying drawings.

BRIEF DESCRIPTION OF THE DRAWINGS

FIG. 1, previously described, shows very schematically in block form a system for manufacturing an integrated circuit of the type to which embodiments of the present invention apply;

FIG. 2, previously described, is a schematic plan view of a conventional integrated circuit wafer;

FIG. 3, previously described, illustrates very schematically the structure of a file containing the coordinates of defective or valid integrated circuits;

DETAILED DESCRIPTION

Figure 4:
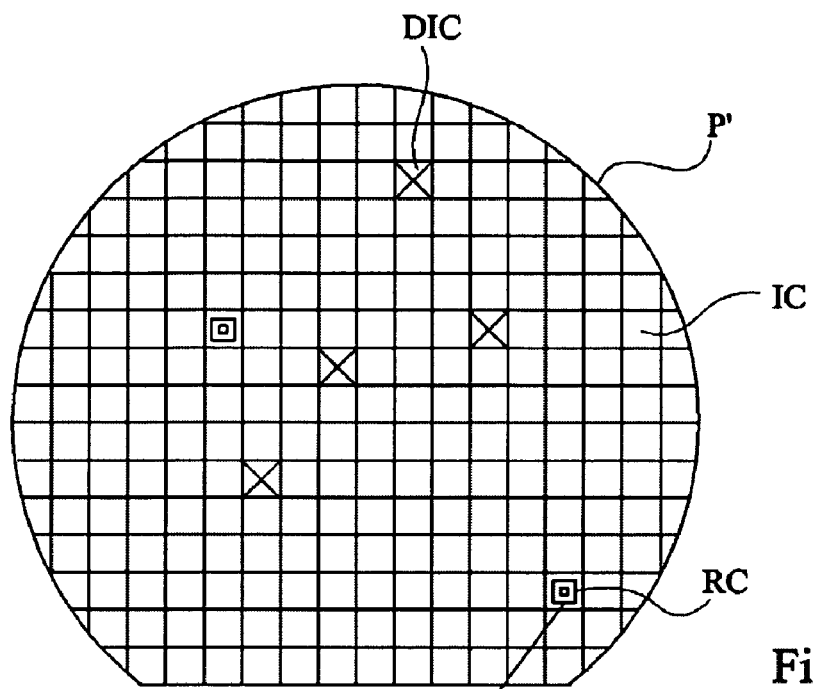
FIG. 4 is a very schematic plan view of an integrated circuit wafer according to an embodiment of the present invention.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

The same elements have been designated with the same reference numerals in the different drawings. For clarity, only those steps and elements which are useful to the understanding of the present invention have been shown in the drawings and will be described hereafter. In particular, the manufacturing of the passive and/or active integrated circuits on any wafer (semiconductor, insulating, etc.) processed by the present invention has not been discussed in detail, the present invention being compatible with all conventional wafers. Further, the equipment for picking and placing based on a visual identification and by processing of a coordinate file has not been discussed in detail, the present invention being again compatible with known equipments.

A feature of an embodiment of the present invention is to provide, in a wafer supporting integrated circuits, one or several reference chips comprising patterns compatible with visual recognition, which are different from the patterns on the integrated circuits fabricated on the wafer. One embodiment of the present invention provides at least two specific reference chips having one or several patterns that can be recognized by the pick-and-place equipment.

FIG. 4 is a very schematic plan view of a wafer P' according to an embodiment of the present invention. As explained previously, wafer P' comprises valid and defective integrated circuit chips IC and DIC. According to this embodiment, two reference chips RC comprising specific patterns, different from the visually-recognizable patterns of circuits IC, are provided on wafer P'.

Figure 4A:
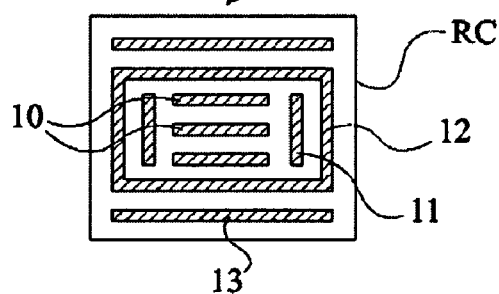
FIG. 4A shows FIG. 4 in greater detail, illustrating an example of patterns of a reference chip according to an embodiment of the present invention.

FIG. 4A shows an enlargement of chip RC taken for example from FIG. 4. This drawing illustrates different patterns that can be automatically visually recognized by a conventional pick-and-place equipment, while being different from the patterns likely to be on integrated circuits. For example, several rectilinear parallel opaque patterns 10, surrounded by two perpendicular opaque patterns 11, may be provided. A pattern 12 surrounding patterns 10 and 11, possibly itself surrounded by one or several rectilinear patterns 13, may also for example be provided. Different combinations of opaque patterns may be envisioned, provided that these patterns are, individually and/or in combination, identifiable by the pick-and-place equipment as different from those of an integrated circuit chip IC. The selection of such patterns is within the abilities of those skilled in the art based on the functional indications given in the present description.

According to a preferred embodiment of the present invention, the positions of reference chips RC are recorded in a file (FILE, FIG. 1) at the same time as a number enabling identification of wafer P' and as the mapping of the valid or defective chips by their respective coordinates.

Once manufactured and tested, the wafer is conventionally transmitted to the installation or the sawing and assembly site (2, FIG. 1). Similarly, the file containing the mapping of the chips of this wafer is conventionally transmitted to this site which is generally distant.

On the assembly installation side, the reference chips are searched by the pick-and-place equipment by implementing algorithms similar to conventional search algorithms from the wafer center and the recorded approximate position of these reference chips. However, here there is no risk that a chip other than the reference chip will be the basis. For the case where the approximate positioning points towards another chip IC or DIC, the equipment detects the absence of a reference pattern and starts a spiral search around this other chip to find the reference chip.

An advantage of embodiments of the present invention is that the coordinates recorded in the file representing the mapping of the integrated circuit wafer may be correctly exploited whatever the chip size.

Another advantage of embodiments of the present invention is that if the pick-and-place equipment stops during processing, it is possible to find the reference again since the chip(s) used as a reference have remained on the adhesive film.

By preferably using several reference chips, it is possible to correct a non-homogeneous expansion of the film supporting the chips, caused for example by the fact that integrated circuits of different sizes are contained on a same wafer.

In applications where several types of chips are contained on a same wafer, two reference chips are sufficient in the implementation of embodiments of the present invention whereas in a conventional case, the chip which has been used as a reference position risks being lost if it is assembled before the chips of different sizes are processed.

If the visual recognition performed by the pick-and-place equipment only relates to a portion of the integrated circuit chip, the specific pattern provided by embodiments of the present invention must be different from that of a correct chip in this examined area.

According to a preferred embodiment of the present invention, the optically-recognizable patterns of the reference chips are formed by means of a specific passivation mask. The choice of a passivation mask is linked to the fact that generally this mask is the least expensive mask among the different masks used for integrated circuit manufacturing.

Figure 5:
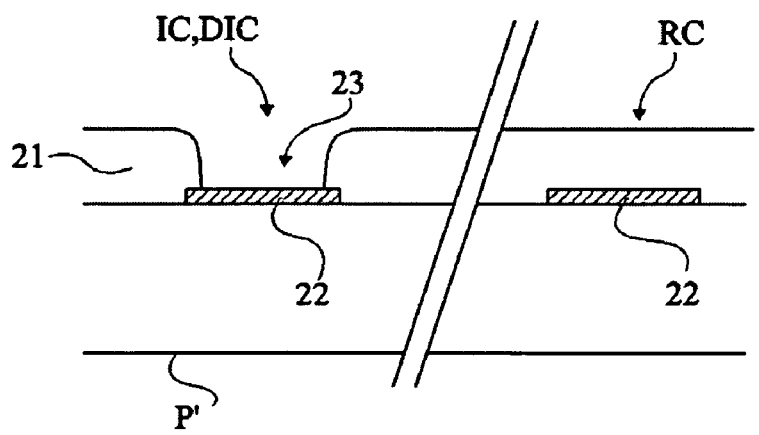
FIG. 5 illustrates, in schematic cross-section view, a way of forming a pattern of a reference chip according to an embodiment of the present invention.

FIG. 5 shows very schematically, in cross-section view, a way of forming a pattern by means of such a passivation mask. For example, after forming the different components (not shown) on wafer P, passivation layer 21 is deposited full plate on the last metallization level in which, among other things, chip-connection conductive pads 22 have been formed. Such pads are formed at least in an area corresponding to the integrated circuit chips, be they valid IC, or defective DIC, and in a corresponding area of reference chip RC (identical mask). For simplicity, the other tracks and levels of the chips in wafer P have not been shown.

By means of a first conventional mask, openings 23 are formed above pads 22 to recover the chip contacts. A second specific mask is superimposed when the regions supporting chips RC are exposed, to completely mask these areas in the reference chips, thus enabling optical differentiation between reference chips RC and normal chips IC.

According to a simplified embodiment, a single mask is used with one of the chip patterns that it comprises (generally, a same mask reproduces several chips) representing the specific reference chip. This embodiment is however reserved for use in cases in which the loss of a chip by photolithographic exposure can be allowed.

According to another alternative embodiment, the pattern differentiations are provided in the last metallization level. The used passivation mask then remains identical for the entire wafer and the differentiation between the reference chip and the normal chips is provided by the metal level.

Of course, various alterations, modifications, and improvements to embodiments of the present invention will readily occur to those skilled in the art. In particular, the practical implementation of embodiments of the present invention based on the functional description given above is within the abilities of those skilled in the art. Further, although embodiments of the present invention have been described in relation to an example of rectilinear geometric patterns, any type of patterns may be envisioned, provided that they are patterns or a combination of patterns that are unlikely to be reproduced on a valid chip. The selection of these patterns is preferably performed to be compatible with several ranges of integrated circuit. Alternatively, several types of reference patterns may be used according to the types of wafers manufactured. In this case, the patterns are, for example, transmitted in the form of a digital file to the assembly site at the same time as the file containing the chip coordinates.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of alignment of an integrated circuit chip pick-and-place equipment with an origin position of a wafer that supports these circuits, wherein at least one reference pattern formed on a reference chip during manufacture of the integrated circuits is optically searched on the wafer, the reference pattern being different from optically-recognizable patterns on other chips, and wherein the reference chip comprises geometric patterns that can be optically recognized in a passivation level or in a last metallization level of the wafer.

2. The method of claim 1, wherein several reference chips are distributed in the wafer.

3. A system of integrated circuit assembly by means of a visual recognition pick-and-place equipment, comprising means for implementing the method of claim 1.

4. An integrated circuit wafer, comprising at least one reference chip comprising in a passivation level or in a last metal level of the chip at least one optically-recognizable pattern, different from the patterns of the other chips formed in the wafer.

5. A method of aligning a wafer and a pick-and-place piece of equipment, the wafer including a plurality of integrated circuits formed on the wafer and the wafer further including a passivation layer and a metallization layer, and the method comprising:

forming a first optically recognizable reference pattern in the passivation layer or the metallization layer of at least one reference integrated circuit contained on the wafer; and forming a second optically recognizable pattern on the integrated circuits other than each reference integrated circuit, the second optically recognizable pattern being different than the first optically recognizable reference pattern.

6. The method of claim 5 wherein each first optically recognizable reference pattern comprises a plurality of rectilinear parallel opaque patterns, a plurality of perpendicular opaque patterns adjacent the rectilinear parallel opaque patterns, and an opaque pattern surrounding the rectilinear parallel opaque patterns and the perpendicular opaque patterns.

7. The method of claim 1 further comprising creating an electronic file containing data regarding the location of each reference integrated circuit and data regarding which ones of the other integrated circuits are functional and/or defective.

8. The method of claim 7 further comprising:
sawing the wafer to separate the integrated circuits;
removing functional ones of the sawed integrated circuits and not removing during this operation the reference integrated circuits.

9. The method of claim 1 wherein some of the integrated circuits in the wafer are different sizes than other ones of the integrated circuits.

10. A wafer comprising a plurality of integrated circuits formed on the wafer, the wafer including a passivation layer and a metallization layer, and the wafer including at least one reference integrated circuit containing a first optically recognizable reference pattern formed in the passivation layer or the metallization layer, and at least some of the remaining integrated circuits containing a second optically recognizable pattern, the second optically recognizable pattern being different than the first optically recognizable reference pattern.

11. The wafer of claim 10 wherein each first optically recognizable reference pattern comprises a plurality of rectilinear parallel opaque patterns, a plurality of perpendicular opaque patterns adjacent the rectilinear parallel opaque patterns, and an opaque pattern surrounding the rectilinear parallel opaque patterns and the perpendicular opaque patterns.

12. The wafer of claim 10 wherein some of the integrated circuits in the wafer are different sizes than other ones of the integrated circuits.

13. An integrated circuit test system, comprising:
a plurality of wafers, each wafer including a plurality of integrated circuits formed on the wafer, the wafer including a passivation layer and a metallization layer, and the wafer including at least one reference integrated circuit containing a first optically recognizable reference pattern formed in the passivation layer or the metallization layer, and at least some of the remaining integrated circuits containing a second optically recognizable pattern, the second optically recognizable pattern being different than the first optically recognizable reference pattern;
a front end test station operable to test the wafers and to generate a file indicating which ones of the integrated circuits are functional and/or defective; and
a back end test station adapted to receive the tested wafers and a file from the front end work station, the back end test station operable to remove functional ones of the integrated circuits from the wafers using the file and the first optically recognizable reference pattern and the second optically recognizable pattern.

14. The integrated circuit test station of claim 13 wherein the file comprises an electronic file.

15. The integrated circuit test station of claim 14 wherein the file only indicates the locations of defective ones of the integrated circuits.

16. The integrated circuit test station of claim 13 wherein the back end test station is operable to saw the wafers as part of removing functional ones of the integrated circuits.

17. The integrated circuit test system of claim 16 wherein some of the integrated circuits are different sizes than other ones of the integrated circuits.

18. The integrated circuit test system of claim 13 wherein the first optically recognizable reference pattern includes a geometric pattern including a plurality of parallel opaque elements.

19. The method of claim 1 wherein each first geometric pattern comprises a plurality of rectilinear parallel opaque patterns, a plurality of perpendicular opaque patterns adjacent the rectilinear parallel opaque patterns, and an opaque pattern surrounding the rectilinear parallel opaque patterns and the perpendicular opaque patterns.

20. The method of claim 1 wherein some of the integrated circuits in the wafer are different sizes than other ones of the integrated circuits.

* * * * *

UNITED STATES PATENT AND TRADEMARK OFFICE
CERTIFICATE OF CORRECTION

PATENT NO. : 7,629,186 B2
APPLICATION NO. : 11/392130
DATED : December 8, 2009
INVENTOR(S) : Jean-Louis Siaudeau It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 740 days.

Signed and Sealed this

Second Day of November, 2010

David J. Kappos
*Director of the United States Patent and Trademark Office*